ус005646905A

United States Patent [19]

Pogrebnoy

[11] Patent Number: 5,646,905
[45] Date of Patent: Jul. 8, 1997

[54] SELF-CLOCKING SENSE AMPLIFIER OPTIMIZED FOR INPUT SIGNALS CLOSE TO VDD

[75] Inventor: Yuri L. Pogrebnoy, Moscow, Russian Federation

[73] Assignee: Sun Microsystems, Inc., Mountain View, Calif.

[21] Appl. No.: 640,007

[22] Filed: Apr. 30, 1996

[51] Int. Cl.$^6$ .................................................. G11C 13/00
[52] U.S. Cl. .................. 365/233; 361/230.01; 361/238.5
[58] Field of Search .......................... 307/530; 365/233, 365/189.01, 230.01, 238.5

[56] References Cited

U.S. PATENT DOCUMENTS

5,363,330  11/1994  Kobayashi et al. .................. 365/238.5

*Primary Examiner*—Terrell W. Fears
*Attorney, Agent, or Firm*—D'Alessandro & Ritchie

[57] ABSTRACT

A self-clocking sense amplifier includes first and second input nodes and first and second output nodes. A first N-Channel transistor has its drain connected to the first output node and its gate connected to the second output node. A second N-Channel transistor has its drain connected to the second output node and its gate connected to the first output node. An N-Channel pulldown transistor has its source connected to a first supply voltage potential, a drain connected to the drain of the first and second N-Channel transistors, and a gate connected to a pulldown node. A first P-Channel transistor has a source connected to the first input node, a drain connected to the first output node, and a gate connected to the second output node. A second P-Channel transistor has a source connected to the second input node, a drain connected to the second output node, and a gate connected to the first output node. A first P-Channel pullup transistor has a source connected to a second supply voltage potential, a drain connected to the first input node, and a gate connected to a pullup node. A second P-Channel pullup transistor has a source connected to the second supply voltage potential, a drain connected to the second input node, and a gate connected to the pullup node. A N-Channel equalizing transistor has a first drain/source terminal connected to the first output node, a second drain/source terminal connected to the second output node, and a gate connected to the pullup node. A first switch is connected between a first input port and the first input node, a second switch is connected between a second input port and the second input node. Switching circuitry maintains a first state wherein the pullup node is held at a logic low state and the pulldown node is held at a logic high state, and is responsive to a initial edge of a clock pulse to place it in a second state wherein the pullup node is held at a logic high state and the pulldown node is held at a logic low state until the voltages at the first and second output nodes reach a set value, and returns to the first state.

3 Claims, 2 Drawing Sheets

SELF-CLOCKING SENSE AMPLIFIER OPTIMIZED FOR INPUT SIGNALS CLOSE TO VDD

BACKGROUND OF THE INVENTION

1. Field Of The Invention

The present invention relates to integrated circuit electronics and to sense-amplifier circuits. More particularly, the present invention relates to a self-clocking multi-input sense amplifier.

2. The Prior Art

Numerous sense amplifier circuits are known in the prior art. Typical of such prior-art sense amplifier technology is the sense amplifier disclosed in Blalock et al., "A High Speed Clamped Bi-Line Current-Mode Sense Amplifier", IEEE Jour. of Solid State Circuits, Vol. 26, No. 4, April 1991.

This particular sense amplifier is intended for use in dynamic memories and provides high response speed independent of bit line capacitance. While providing generally satisfactory operation, sense amplifiers such as this suffer from one or more of several problems. First, a special precharge pulse is required. Its duration directly affects total sensing time and variations in precharge time affect output signal timing. In addition, such sense amplifiers provide a relatively low tolerance for the inevitable mismatch of transistor parameters.

It would be advantageous to provide a self-clocked sense amplifier which avoids one or more shortcomings of prior-art sense amplifiers.

It is therefore an object of the present invention to provide a self-clocking sense amplifier.

A further object of the present invention is to provide a self-clocking sense amplifier optimized for signals close to VDD.

BRIEF DESCRIPTION OF THE INVENTION

A self-clocking sense amplifier according to the present invention is useful for multiport operation and is optimized for input signals close to VDD. The self-clocking sense amplifier of the present invention includes first and second complementary input nodes and first and second complementary output nodes, A first N-Channel transistor has a drain connected to said first complementary output node and a gate connected to the second complementary output node. A second N-Channel transistor has its drain connected to the second complementary output node and a gate connected to the first complementary output node. A pulldown transistor has a source connected to a first supply voltage potential, a drain connected to the drain of the first and second N-Channel transistors, and a gate connected to a pulldown node.

A first P-Channel transistor has a source connected to the first complementary input node, a drain connected to the first complementary output node, and a gate connected to the second complementary output node. A second P-Channel transistor has a source connected to the second complementary input node, a drain connected to the second complementary output node, and a gate connected to the first complementary output node. A first P-Channel pullup transistor has a source connected to a second supply voltage potential, a drain connected to the first complementary input node, and a gate connected to a pullup node. A second P-Channel pullup transistor has a source connected to the second supply voltage potential, a drain connected to the second complementary input node, and a gate connected to the pullup node. An N-Channel equalizing transistor has a first drain/source terminal connected to the first complementary output node, a second drain/source terminal connected to the second complementary output node, and a gate connected to the pullup node.

A first switch in at least one pair of switches is connected between a first complementary input port and the first complementary input node, a second switch in the at least one pair is connected between a second complementary input port and the second complementary input node. The sense amplifier of the present invention is suitable for multiport inputs and more than one pair of switches is thus contemplated for use therewith.

Switching circuitry is provided and has a first stable state and a second metastable state, the switching circuitry existing in the first state wherein the pullup node is held at a logic low state and the pulldown node is held at a logic high state. The switching circuitry is responsive to a initial edge of a clock pulse to place it in the second state wherein the pullup node is held at a logic high state and the pulldown node is held at a logic low state until the voltages at the first and second output nodes reach a set value, the switching circuitry responsive to the set value to return it to the first state.

DETAILED DESCRIPTION OF A PREFERRED EMBODIMENT

Those of ordinary skill in the art will realize that the following description of the present invention is illustrative only and not in any way limiting. Other embodiments of the invention will readily suggest themselves to such skilled persons.

Figure 1:
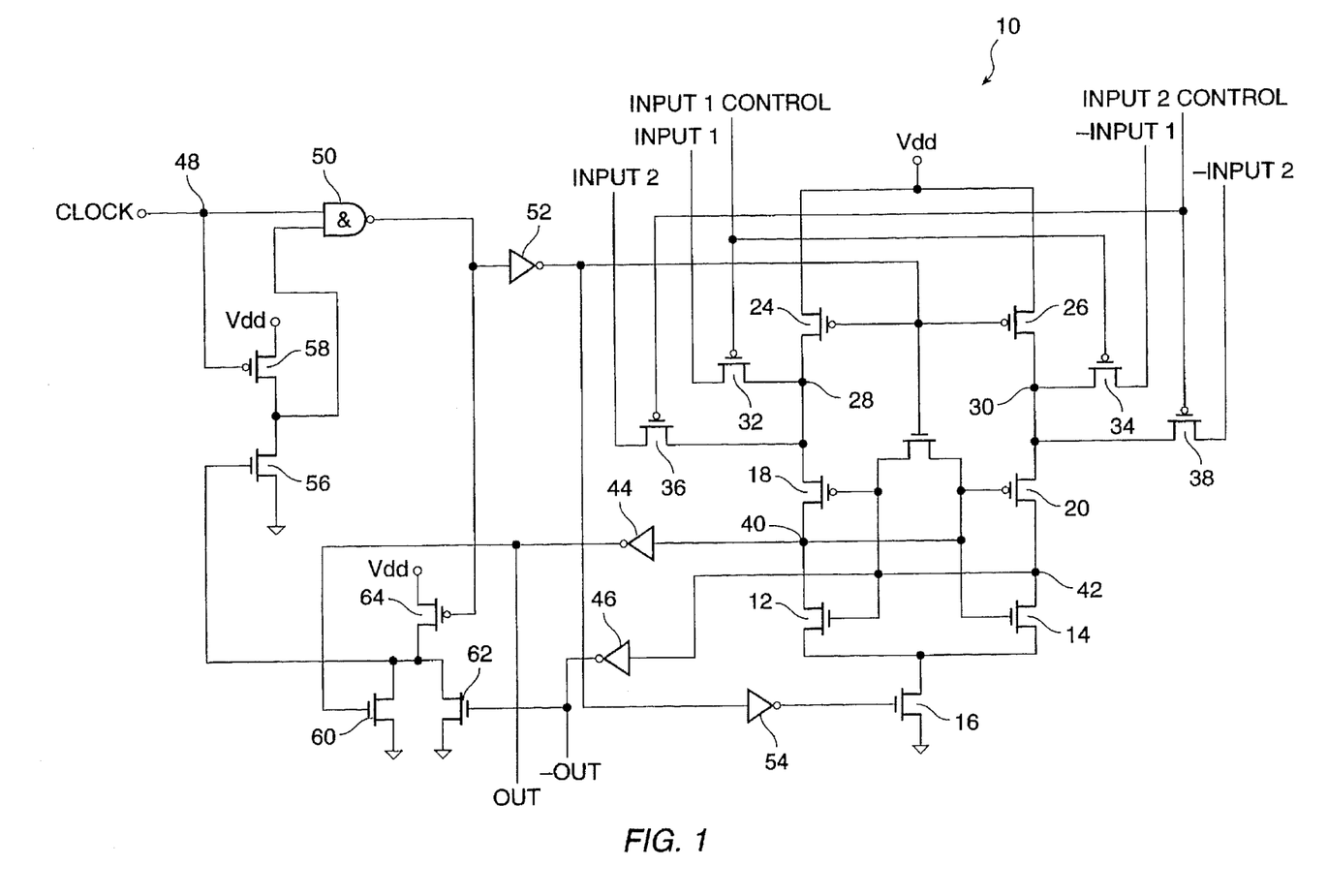
FIG. 1 is a schematic diagram of a self-clocking sense amplifier optimized for input signals close to VDD according to the present invention.

Referring first to FIG. 1, a schematic diagram of a self-clocking sense amplifier according to the present invention is presented. Self-clocking sense amplifier 10 includes N-Channel flip-flop transistors 12 and 14, having their sources tied together to the drain of an N-Channel pulldown transistor 16. The source of N-Channel pulldown transistor 16 is connected to a fixed voltage potential, such as ground. The gate of N-Channel flip-flop transistor 12 is connected to the drain of N-Channel flip-flop transistor 14 and the gate of N-Channel transistor 14 is connected to the drain of N-Channel flip-flop transistor 12 in a cross-coupled configuration.

The drain of N-channel flip-flop transistor 12 is connected to the drain of P-Channel flip-flop transistor 18 and the drain of N-channel flip-flop transistor 14 is connected to the drain of P-Channel flip-flop transistor 20. The gate of P-Channel flip-flop transistor 18 is connected to the gate of N-Channel flip-flop transistor 12 and the gate of P-Channel flip-flop transistor 20 is connected to the gate of N-Channel flip-flop transistor 14. N-Channel equalizing transistor 22 is connected between the common gates of flip-flop transistors 12 and 18 and the common gates of flip-flop transistors 14 and 20.

The source of P-Channel flip-flop transistor 18 is connected to the drain of P-Channel pullup transistor 24. The source of P-Channel flip-flop transistor 20 is connected to the drain of P-Channel pullup transistor 26. The sources of P-Channel pullup transistors 24 and 26 are connected together to a fixed voltage potential VDD. The gates of pullup P-Channel transistors 24 and 26 are connected to the gate of N-Channel equalizing transistor 22.

The common connection of the source of P-Channel flip-flop transistor 18 and the drain of P-Channel pullup transistor 24 form a first complementary input node 28 for sense amplifier 10 and the common connection of the source of P-Channel flip-flop transistor 20 and the drain of P-Channel pullup transistor 26 form a second complementary input node 30 for sense amplifier 10. The sense amplifier 10 of the present invention may be multiported, and to that end, a first pair of P-Channel input transistors 32 and 34 are provided. P-Channel input transistor 32 is connected between an input1 node and input node 28 of sense amplifier 10 and P-Channel input transistor 34 is connected between a −input1 node and input node 30 of sense amplifier 10. The gates of the first pair of P-Channel input transistors 32 and 34 are connected together to an input1 control node.

In addition, a second pair of P-Channel input transistors 36 and 38 are provided. P-Channel input transistor 36 is connected between an input2 node and input node 28 of sense amplifier 10 and P-Channel input transistor 38 is connected between a −input2 node and input node 30 of sense amplifier 10. The gates of the second pair of P-Channel input transistors 36 and 38 are connected together to an input2 control node. Those of ordinary skill in the art will recognize that, while two input nodes are shown in the sense amplifier 10 of FIG. 1, other numbers of input nodes may easily be provided by employing further pairs of input transistors.

The common drain connections of flip-flop transistors 12 and 18 form a first output node 40 for the sense amplifier 10 and the common drain connections of flip-flop transistors 14 and 20 form a second output node 42 thereof. Inverter 44 is driven by first output node 40 and inverter 46 is driven by its complementary output node 42. The outputs of inverters 44 and 46 form outputs of the sense amplifier 10.

Clocking of sense amplifier 10 is provided by a clock signal appearing on clock node 48. A clock signal on clock node 48 drives a first input of a clock-input NAND gate 50. The output of clock-input NAND gate 50 drives inverter 52. The output of inverter 52 drives the gates of transistors 22, 24, and 26. The output of inverter 52 also drives inverter 54 which, in turn, drives the gate of N-Channel pulldown transistor 16.

A second input of clock-input NAND gate 50 is driven by the common drain node of N-Channel transistor 56 and P-Channel transistor 58, connected in series between VDD and ground. The gate of P-Channel transistor 58 is driven by clock node 48 and the gate of N-Channel transistor 56 is driven by a node comprising the common drains of N-Channel transistors 60 and 62 and P-Channel transistor 64. The sources of N-Channel transistors 60 and 62 are connected to ground and the source of P-Channel transistor 64 is connected to VDD. The gate of N-Channel transistor 60 is driven by the output of inverter 44 and the gate of N-Channel transistor 62 is driven by the output of inverter 46. The gate of P-Channel transistor 64 is connected to the output of clock-input NAND gate 50.

The sense amplifier 10 of FIG. 1 operates in two modes, a preliminary mode, and a sense mode. When the clock signal is low the flip-flop (transistors 12, 14, 18, and 20) is in active mode, because signal at the output of inverter 52 is low too. As a result, one of the output nodes 40 and 42 is high and the other is low. Thus, the output of one of the inverters 44 and 46 is high, and one of N-Channel transistors 60 and 62 (which, with inverters 44 and 46, form an output NAND gate) is on. As a result, the common drain node of transistors 60 and 62 (the output of the output NAND gate) is low. Also, P-Channel transistor 58 is turned on due to the low level clock signal. Prior to arrival of the rising edge of the clock pulse, the output of clock-input NAND gate 50 is high, thus assuring that P-Channel transistor 64, which it drives, is turned off. Under these conditions, the data input to clock-input NAND gate 50 is high.

The preliminary mode is initiated by the rising edge of a clock pulse delivered to clock node 48. The rising edge of the clock signal at the first input of clock-input NAND gate 50 causes its output to become low. The output of inverter 52 therefore becomes high, turning off P-Channel pullup transistors 24 and 26 and turning on N-Channel equalizing transistor 22. At about the same time (one gate delay later) the output of inverter 54 goes low, turning off N-Channel pulldown transistor 16. With the pullup and pulldown transistors turned off, the sense amplifier 10 is shut off.

At this time, inputs are provided to the input nodes of the sense amplifier 10 by activating either of the input1 or input2 control nodes to connect complementary inputs −input1/input1 or −input2/input2 to the complementary input nodes 28 and 30 of the sense amplifier. The sense amplifier 10 of the present invention is designed to sense complementary signals having a small voltage differential. For example, the signal on one bit line could be VDD and the signal on the complementary bit line could be from about 20 mV to about 500 mV less than VDD. It is important that the complementary input signals be present and valid during the time that the output of inverter 52 is high.

Because transistor 22 is turned on, the output nodes 40 and 42 of the sense amplifier are shorted together and the voltages on them are equalized. Initially, this equalized voltage value on output nodes 40 and 42 is about 2 V. The capacitances of output nodes 40 and 42 begin to charge towards VDD from the sense voltages on the complementary inputs through the P-Channel pass transistors 32 and 34 or 36 and 38, depending on which port is being read and through P-Channel flip-flop transistors 18 and 20.

The voltage differential between the complementary inputs is transferred to the output nodes 40 and 42 via this charging mechanism. As will be appreciated by those of ordinary skill in the art, the voltages on output nodes 40 and 42 approach VDD, the conductance of N-Channel equalizing transistor 22 begins to diminish when the potentials of its drain and source approach VDD - Vth. Thus, as the output nodes 40 and 42 approach VDD, N-Channel equalizing transistor 22 shuts off to permit establishment of the voltage differential representing the output of the memory cell being read.

Prior to the voltages on output nodes 40 and 42 reaching the switching voltage of the inverters 44 and 46, N-Channel output NAND gate transistors 60 and 62 remain on. Their common drain node remains low despite the fact that P-Channel transistor 64 is on, because P-Channel transistor is sized smaller than N-Channel NAND gate transistors 60 and 62. N-Channel transistor 56 remains off, and the data input to clock-input NAND gate 50 remains at a high potential even though the rising clock edge at clock input node 48 has turned off P-Channel transistor 58.

At the moment when potentials of both output nodes 40 and 42 reach the input switching voltage of the inverters 44 and 46, they will switch states and N-Channel output NAND gate transistors 60 and 62 will be switched off. Their common drain node will be pulled high by P-Channel transistor 64 which is still on. N-Channel transistor 56 will turn on, pulling the data input to clock-input NAND gate 50 low. The output of the clock-input NAND gate 50 will change state. Consequently, the output of inverter 52 will go low and the sense amplifier flip-flop comprising transistors 12, 14, 18, and 20 returns to its active (sense) mode. One of its output nodes 40 and 42 is driven low in accordance with the input voltage differential which has been placed on them during the preliminary mode. Thus, if output node 40 has been charged to VDD and output node 42 has been charged to (for example) VDD - 100 mV, output node 42 will be driven to ground when the output of inverter 52 goes low.

Figure 2:
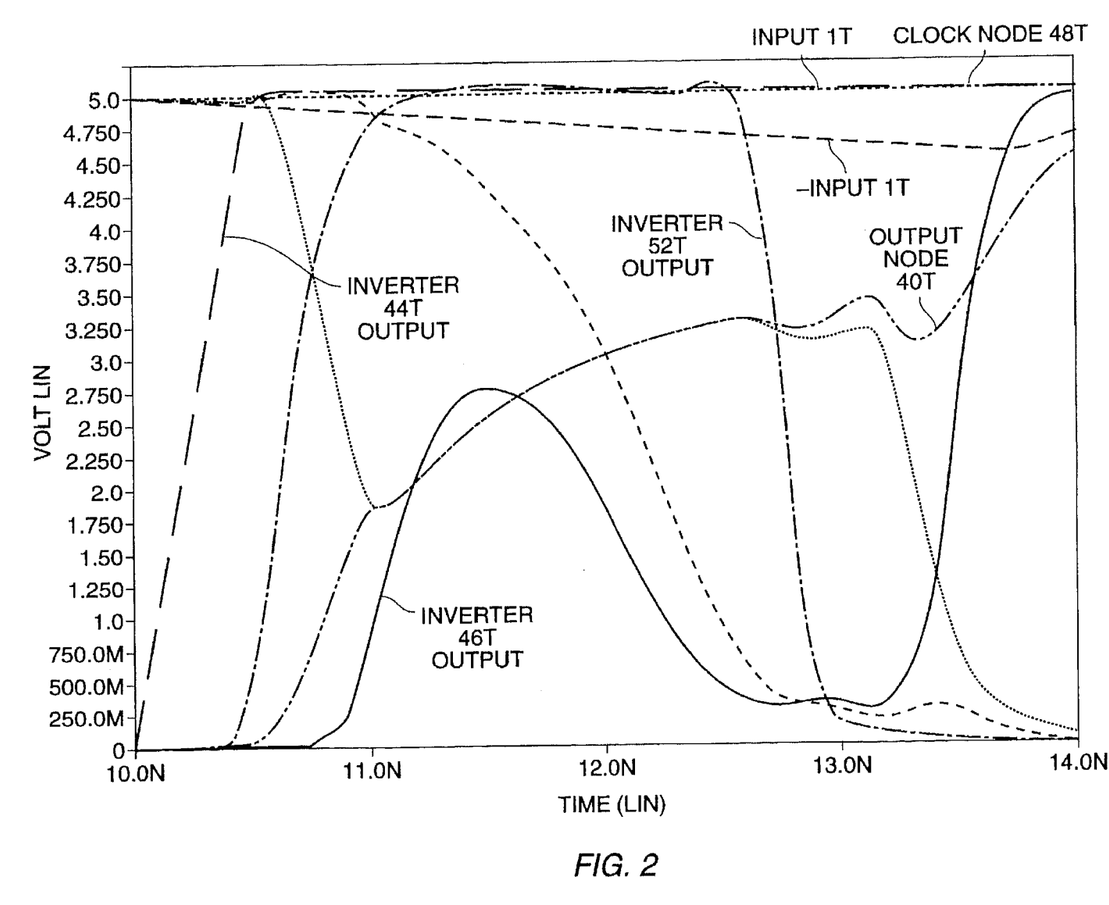
FIG. 2 is a timing diagram showing the waveforms at selected nodes in the self-clocking sense amplifier of FIG. 1.

FIG. 2 is a timing diagram of the operation of sense amplifier 10 from FIG. 1 when the sense amplifier 10 is in the preliminary mode. There are seven traces shown in FIG. 2, these traces correspond to various inputs, outputs and internal signals of the sense amplifier 10. Accordingly, the traces are referenced to the features identified in FIG. 1 to aid the explanation of the operation of the timing diagram in FIG. 2.

In the timing diagram, the trace of the clock input at clock node 48, indicated as clock node 48T, is at a high level (Vdd) of 5 volts. The trace of the output of inverter 52, indicated as inverter 52T output, follows the clock input after a gate delay. As explained above, the high output form inverter 52 causes the sense amplifier 10 to shut off. Concurrently, inputs are provided to the input nodes, input1 and −input1. The traces of these inputs are indicated as input1T and −input1T, respectively. It should be observed that the voltage of input1T is Vdd and the voltage of −input1T is lower than Vdd by less than about 500 mV.

When inverter 52T output, following the clock node 48T, goes high and shuts down the sense amplifier 10, the outputs at the first and second output nodes 40 and 42, whose traces are indicated as output node 40T and output node 42T, begin charging together towards Vdd in response to input1T and −input1T, respectively. As output node 40T and output node 42T charge toward Vdd, the outputs of inverters 44 and 46, whose traces are indicated as inverter 44T output and inverter 46T output, will switch and go low.

In accordance with the explanation of FIG. 1 given above, it can be observed that when inverter 44T output and inverter 46T output go low, inverter 52T output also goes low. As a result, the sense amplifier 52 is turned on, and the difference between input1T and −input1T is sensed. As can be seen in FIG. 2, when the voltages input1T and −input1T are sensed, the output node 40T which responds to input1T goes high, the output node 42T which responds to −input1T goes low, and the inverter 44 and 46 connected to first and second output nodes 40 and 42, respectively, respond accordingly.

The sense amplifier of the present invention has numerous advantages over the prior art. First, it provides a small intrinsic delay leading to fast switching in the active mode due to the positive feedback in the flip-flop. In addition, the sense amplifier of the present invention shows only a weak dependence on the number of input ports. The sense amplifier of the present invention does not need special strobe pulse. The internal self-clocking circuit provides the necessary duration of the preliminary mode.

While embodiments and applications of this invention have been shown and described, it would be apparent to those skilled in the art that many more modifications than mentioned above are possible without departing from the inventive concepts herein. The invention, therefore, is not to be restricted except in the spirit of the appended claims.

What is claimed is:

1. A self-clocking sense amplifier comprising:

first and second complementary input nodes;

first and second complementary output nodes;

a clock input node;

a first N-Channel transistor having a drain connected to said first output node, a gate connected to said second output node, and a source;

a second N-Channel transistor having a drain connected to said second output node, a gate connected to said first output node, and a source;

an N-Channel pulldown transistor having a source connected to a first supply voltage potential, a drain connected to said sources of said first and second N-Channel transistors, and a gate connected to a pulldown node;

a first P-Channel transistor having a source connected to said first input node, a drain connected to said first output node, and a gate connected to said second output node;

a second P-Channel transistor having a source connected to said second input node, a drain connected to said second output node, and a gate connected to said first output node;

a first P-Channel pullup transistor having a source connected to a second supply voltage potential, a drain connected to said first input node, and a gate connected to a pullup node;

a second P-Channel pullup transistor having a source connected to said second supply voltage potential, a drain connected to said second input node, and a gate connected to said pullup node;

an N-Channel equalizing transistor having a first drain/source terminal connected to said first output node, a second drain/source terminal connected to said second output node, and a gate connected to said pullup node;

at least one pair of switches, a first switch in said at least one pair connected between a first input port and said first input node, a second switch in said at least one pair connected between a first complementary input port and said second input node;

switching circuitry having a first stable state and a second metastable state, said switching circuitry existing in said first state wherein said pullup node is held at a logic low state and said pulldown node is held at a logic high state, and responsive to a initial edge of a clock pulse on said clock input node to place it in said second state wherein said pullup node is held at a logic high state and said pulldown node is held at a logic low state until the voltages at said first and second output nodes reach a set value, said switching circuitry responsive to said set value to return to said first state.

2. The self-clocking sense amplifier of claim 1 wherein said at least one pair of switches comprises:

a first P-Channel input transistor having a first source/drain terminal connected to a first input port, a second source/drain terminal connected to said first complementary input node, and a gate connected to a first port control node, and a second P-Channel input transistor having a first source/drain terminal connected to a first complementary input port, and a gate connected to said first port control node.

3. The self-clocking sense amplifier of claim 1 wherein said switching circuitry comprises:

a clock-input NAND gate having a first input connected to said clock input node, a second input, and a data output;

a first inverter having an input connected to said data output of said clock-input NAND gate and an output connected to said pullup node;

a second inverter having an input connected to the output of said first inverter and an output connected to said pulldown node;

a third inverter having an input connected to said first output node and an output;

a fourth inverter having an input connected to said second output node and an output;

a pair of N-Channel transistors having their drains connected together and having their sources connected together to said first supply voltage potential, the gate of one of said pair of N-Channel transistors connected to the output of said third inverter and the gate of the other one of said pair of N-Channel transistors connected to the output of said third inverter;

a first P-Channel transistor having a drain connected to the drains of said pair of N-Channel transistors, a source connected to said second supply voltage potential, and a gate connected to said data output of said clock-input NAND gate; and a second P-Channel transistor having a source connected to said second supply voltage potential, a gate connected to the drains of said pair of N-Channel transistors, and a drain connected to the second input of said clock-input NAND gate, and an N-Channel transistor having a drain connected to the drain of the series connected P-Channel transistor, a source connected to said first supply voltage potential, a gate connected to said clock input node, and a drain connected to the second input of said clock-input NAND gate.

* * * * *

UNITED STATES PATENT AND TRADEMARK OFFICE
CERTIFICATE OF CORRECTION

Page 1 of 5

PATENT NO. : 5,646,905
DATED : July 8, 1997
INVENTOR(S) : Yuri L. Pogrebnoy

It is certified that error appears in the above-indentified patent and that said Letters Patent is hereby corrected as shown below:

In the Drawings:

In this section of Figure 1:

FIG. 1

UNITED STATES PATENT AND TRADEMARK OFFICE
CERTIFICATE OF CORRECTION

Page 2 of 5

PATENT NO. : 5,646,905
DATED : July 8, 1997
INVENTOR(S) : Yuri L. Pogrebnoy

It is certified that error appears in the above-indentified patent and that said Letters Patent is hereby corrected as shown below:

replace with this corrected section of Figure 1:

*FIG. 1*

UNITED STATES PATENT AND TRADEMARK OFFICE
CERTIFICATE OF CORRECTION

PATENT NO. : 5,646,905
DATED : July 8, 1997
INVENTOR(S) : Yuri L. Pogrebnoy

It is certified that error appears in the above-indentified patent and that said Letters Patent is hereby corrected as shown below:

Figure 2: replace Figure 2, shown below:

FIG. 2

UNITED STATES PATENT AND TRADEMARK OFFICE
CERTIFICATE OF CORRECTION

PATENT NO. : 5,646,905
DATED : July 8, 1997
INVENTOR(S) : Yuri L. Pogrebnoy

It is certified that error appears in the above-indentified patent and that said Letters Patent is hereby corrected as shown below:

with this corrected version of Figure 2:

FIG. 2

UNITED STATES PATENT AND TRADEMARK OFFICE
CERTIFICATE OF CORRECTION

PATENT NO. : 5,646,905
DATED : July 8, 1997
INVENTOR(S) : Yuri L. Pogrebnoy

It is certified that error appears in the above-indentified patent and that said Letters Patent is hereby corrected as shown below:

<u>In the Abstract</u>:

Line 7: replace "An N-Channel" with --A N-Channel--.

Line 32: replace "to a initial" with --to an initial--.

Column 2, line 2: replace "An N-Channel" with --A N-Channel--.

Column 2, line 19: replace " a intial edge" with --an initial edge--.

Column 4, line 59: after "because P-Channel transistor" insert --64--.

Column 5, line 17: replace "seven" with --eight--.

Column 5, line 27: replace "high output form" with --high output from--.

<u>In the Claims</u>:

Column 6, line 48: replace "responsive to a initial" with --responsive to an initial--.

Signed and Sealed this

Twenty-third Day of December, 1997

*Attest:*

BRUCE LEHMAN

*Attesting Officer*    Commissioner of Patents and Trademarks